(12) United States Patent
Wimplinger

(10) Patent No.: US 9,911,713 B2
(45) Date of Patent: Mar. 6, 2018

(54) METHOD FOR APPLYING A BONDING LAYER

(71) Applicant: EV GROUP E. THALLNER GMBH, St. Florian am Inn (AT)

(72) Inventor: Markus Wimplinger, Ried (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/441,741

(22) Filed: Feb. 24, 2017

(65) Prior Publication Data

US 2017/0162538 A1 Jun. 8, 2017

Related U.S. Application Data

(63) Continuation of application No. 14/909,157, filed as application No. PCT/EP2013/069003 on Sep. 13, 2013, now Pat. No. 9,627,349.

(51) Int. Cl.
*H01L 23/00* (2006.01)
*B81C 3/00* (2006.01)

(52) U.S. Cl.
CPC .............. *H01L 24/83* (2013.01); *B81C 3/001* (2013.01); *B81C 2203/036* (2013.01); *H01L 2224/8302* (2013.01); *H01L 2224/83022* (2013.01); *H01L 2224/83894* (2013.01)

(58) Field of Classification Search
None
See application file for complete search history.

(56) References Cited

U.S. PATENT DOCUMENTS

| 9,627,349 B2 * | 4/2017 | Wimplinger | H01L 24/83 |
| 2006/0192291 A1 | 8/2006 | Yokozuka | 257/776 |

| 2011/0121414 A1 | 5/2011 | Rothacher | 257/416 |
| 2012/0115305 A1 | 5/2012 | Peng et al. | 438/455 |
| 2012/0145308 A1 | 6/2012 | Feng et al. | 156/151 |
| 2012/0319303 A1 | 12/2012 | Foster et al. | 257/787 |
| 2012/0321907 A1 | 12/2012 | Hoivik et al. | 428/615 |
| 2013/0099355 A1 | 4/2013 | Liu et al. | 257/532 |

FOREIGN PATENT DOCUMENTS

| CN | 1828881 A | 9/2006 | H01L 23/488 |
| CN | 102883991 B | 1/2013 | B81C 1/00 |
| EP | 2 363 373 A1 | 9/2011 | B81C 1/00 |
| JP | 2004-111935 A | 4/2004 | H01L 21/60 |
| JP | 2006-237419 A | 9/2006 | H01L 25/07 |
| JP | 2012-079935 A | 4/2012 | B23K 1/00 |

OTHER PUBLICATIONS

Tollefsen, "Au—Sn SLID Bonding—Properties and Possibilites," Metallurgical and Materials Transactions B, vol. 43B, Apr. 2012, p. 397.
Aasmundtveit, "High Temperature Shear Strength of SLID bonding: CU—Sn, Au—Sn and Au—In," Electronics System—Integration Technology Conference (ESTCO, Sep. 2014, pp. 1-6.
International Search Report from corresponding International Patent Application No. PCT/EP2013/069003, dated Jun. 12, 2014 (English-language translation provided.
Perez-Quintana et al., "An aluminum-germanium eutectic structure for silicon wafer bonding technology," WILEY-VCH Verlag GmbH & Co. KGaA, Weinheim, phys. stat. sol (c), vol. 10, pp. 3706-2705, Jul. 29, 2005.

\* cited by examiner

*Primary Examiner* — Asok K Sarkar
(74) *Attorney, Agent, or Firm* — Kusner & Jaffe

(57) ABSTRACT

A method for applying a bonding layer that is comprised of a basic layer and a protective layer on a substrate with the following method steps: application of an oxidizable basic material as a basic layer on a bonding side of the substrate, at least partial covering of the basic layer with a protective material that is at least partially dissolvable in the basic material as a protective layer. In addition, the invention relates to a corresponding substrate.

20 Claims, 3 Drawing Sheets

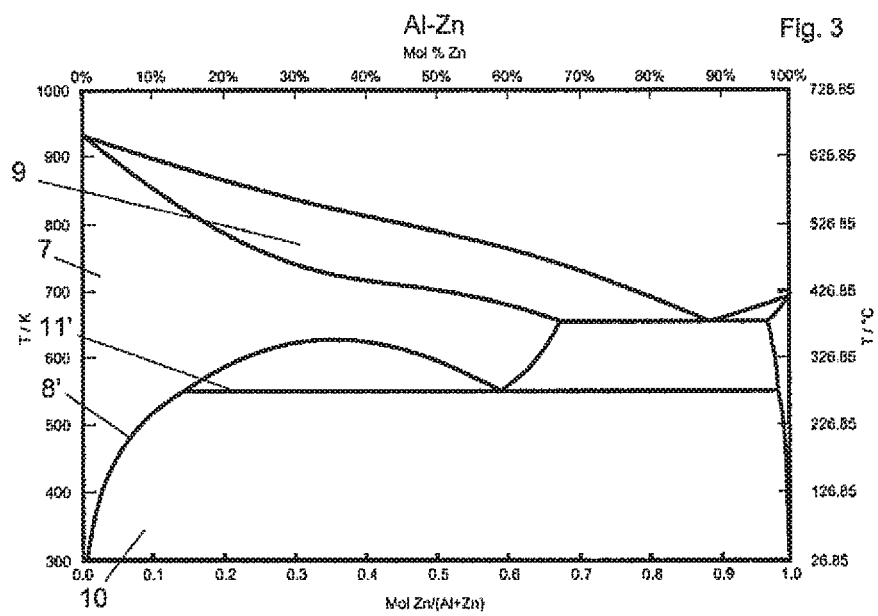
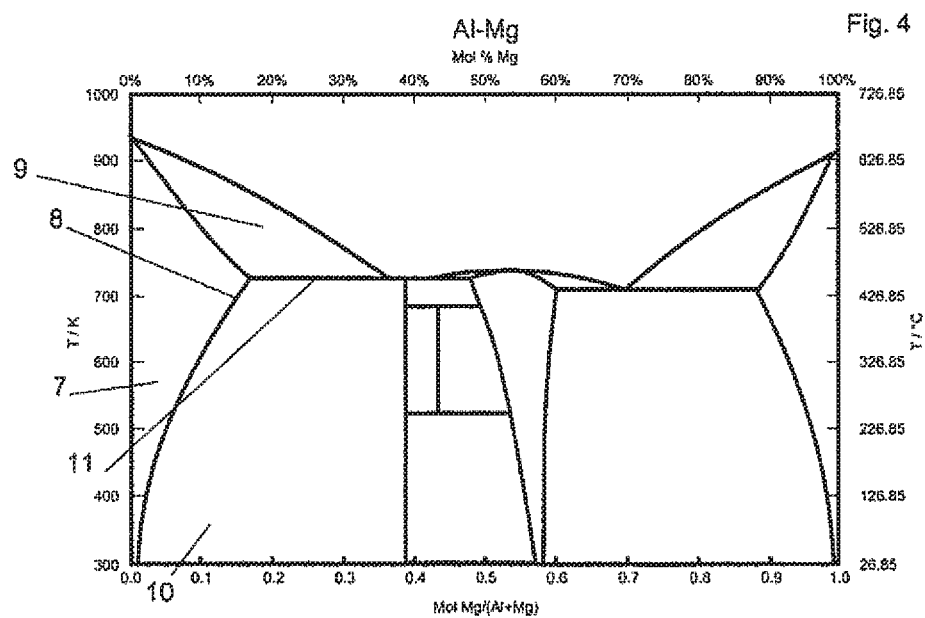

METHOD FOR APPLYING A BONDING LAYER

RELATED APPLICATIONS

This application is a continuation of U.S. application Ser. No. 14/909,157, filed Feb. 1, 2016, which is a U.S. National Stage Application of International Application No. PCT/EP2013/069003, filed Sep. 13, 2013, said patent applications hereby fully incorporated herein by reference.

FIELD OF INVENTION

The invention relates to a method for applying a bonding layer and to a substrate provided with a bonding layer.

BACKGROUND OF INVENTION

In the state of the art, countless methods to connect various materials to one another exist. In the semiconductor industry, in recent years, primarily the bonding technology to connect two substrates temporarily or permanently to one another has gained acceptance. Very often, the bonding process takes place between semiconductor(s) and/or metal structures on the substrate. The best-known metal bonding technology of recent times is copper bonding. Substrates are the carriers for functional assemblies such as microchips, memory chips, or MEMS assemblies. In recent years, increasingly attempts were made to produce a connection between assemblies arranged on various substrates in order to avoid a wire-bonding process between the assemblies that is labor-intensive, costly, and susceptible to flaws. In addition, the direct bonding variant has the enormous advantage of elevated assembly density. The assemblies must no longer be positioned beside one another and connected via wires, but rather are stacked on one another and connected vertically to one another by various technologies. In most cases, the vertical connections are produced by contact points. The contact points of different substrates must be identical to one another and are oriented to one another before the actual bonding process.

Another little-used process is aluminum bonding. In this process, aluminized points on the surface of a substrate are to be bonded with a material lying on a second substrate. In this case, this can be aluminum or a suitable, different material. One drawback of aluminum is its extreme oxygen affinity. Even with copper, the oxygen affinity is high, so that copper oxides must be regularly removed before a bonding process. With aluminum, the oxygen affinity is higher by a multiple. Aluminum still forms relatively thick, passivating aluminum oxide layers, which are difficult to remove. In contrast to copper, aluminum is therefore little used for bonding connections, since at this time, because of the very stable oxide layers, no reliable bonding result can be achieved at a reasonable cost. Nevertheless, aluminum is widely used in the semiconductor area to produce metal connections on the chip surface in the lateral direction. Here, aluminum is distinguished in that it has significantly slower diffusion behavior in silicon than, for example, copper or gold. Metal diffused into silicon would impair the characteristics of transistors or make the latter completely unfunctional. Based on this advantageous diffusion behavior, paired with low costs and relatively good electrical conductivity, aluminum has been established over many years as the material that is mainly used for producing electrical connections laterally on the semiconductor chips. Recently, in chips of the newest generation, aluminum is increasingly being replaced by copper because of its better electrical conductivity; however, aluminum still enjoys great importance, primarily in the production of chips on 200 mm substrates with somewhat older production technology. It is specifically these production surrounding areas/plants that in recent times have found enhanced use for the production of MEMS (micro-electro-mechanical systems) components. The production of these MEMS components in turn frequently requires bonding processes, so that the need for a reliable aluminum bonding process increases. Outside of the semiconductor industry, aluminum is also a structural material that is in demand, since it is light, inexpensive, and primarily hardenable. In the semiconductor industry, based on the above-mentioned reasons, it has been attempted for some time to develop processes that make aluminum usable as structural material and in particular material for bonding connections.

The greatest problem when using oxygen-affine materials such as copper and aluminum is the avoidance of oxidation on bonding surfaces and/or the complete removal of oxide from bonding surfaces before a bonding process. Extremely oxygen-affine materials such as aluminum produce, moreover, oxides that are strong and difficult to reduce. Plants for oxide removal are expensive, labor-intensive and under certain circumstances dangerous (toxic substances).

SUMMARY OF INVENTION

The object of this invention is therefore to indicate a method as well as a substrate provided with a bonding layer, with which an oxidizable material (such as in particular aluminum) can be used for bonding.

This object is achieved with the features of the independent claim(s). Advantageous further developments of the invention are indicated in the subclaims. All combinations of at least two of the features indicated in the specification, the claims and/or the figures also fall within the scope of the invention. In the indicated ranges of values, values that lie within the above-mentioned limits are also to be disclosed as boundary values and can be claimed in any combination.

It is an essential idea of this invention to provide a bonding layer, comprised of a basic layer and a protective layer, in particular as a diffusion pair, on the substrate, whereby a basic material of the basic layer can be oxidized, while a protective material of the protective layer can be oxidized at least less easily.

The invention therefore in particular is a matter of a process in which the oxidation of oxygen-affine materials such as in particular aluminum (preferred) or copper is prevented from the start. The protection of oxygen-affine basic material is achieved according to the invention in particular by the deposition of a protective material, which covers the basic material at least partially, in particular primarily, and preferably completely.

The objective breakdown of the elements relative to their oxygen affinity can be most simply defined by the electrochemical voltage sequence. Oxygen-affine elements such as lithium are extremely base materials, are easily oxidized, and therefore act as reducing agents, easily release electrons, and therefore have an extremely negative standard electrode potential. However, elements with a low oxygen affinity are referred to as noble, since the latter can be easily reduced and therefore act as oxidizing agents, accommodate electrons, and have an extremely positive standard electrode potential. As basic material, in particular a material with a standard electrode potential is used that is less than 2.00 V, preferably less than 1.00 V, more preferably less than 0.0 V, most preferably less than −1.0 V, with utmost preference less than −2.0 V, and even more preferably less than −3.0 V. Copper has a standard electrode potential of approximately 0.16 V, aluminum of approximately −1.66 V. The noblest metal is gold with a standard electrode potential of approximately 1.69 V (for the first oxidation stage).

In an especially preferred variant, the basic material and the protective material are located as targets, separated from one another, in a coating chamber and are applied in succession under vacuum, so that no contact of the basic material with an oxygen-containing atmosphere is produced.

An embodiment of the invention is comprised in leaving the protective material on the basic material during the bonding process and, because of its chemical-physical properties, in at least partially, in particular predominantly, and preferably completely dissolving the protective material in the basic material during the bonding process. The selection of the basic material-protective material combination is carried out in such a way that the latter allows a solid dissolution process. The protective material is preferably more readily soluble in the basic material than vice versa.

The protective material is dissolved in particular under specific process conditions in the basic material. The basic material therefore has a boundary solubility for the protective material and/or the basic material can be mixed at least partially, in particular predominantly, and preferably completely with the basic material. In the case of an existing boundary solubility of the protective material in the basic material, the boundary solubility at room temperature is in particular great enough to keep a specific amount of the protective material dissolved. In this way, the protective material according to the invention can be applied as an extremely thin layer in order to avoid local concentration peaks during the diffusion process of the protective material into the basic material that can lead to an (undesired) precipitate.

Another aspect of this invention that is advantageous according to the invention is comprised in preventing a contact of the oxygen-affine basic material with an oxygen-containing or oxygen-rich atmosphere, in particular by at least predominant covering of the surfaces of the basic layer, not covered by the substrate, with the protective layer.

The protective material itself is preferably a solid, in particular at least at room temperature. The latter is therefore not liquid and allows the transport of the protected basic material through an oxygen-containing atmosphere.

In an advantageous embodiment of the invention, the protective material is selected in such a way that the latter is less oxygen-affine than the basic material, or any oxide that is formed on the protective material can be removed with simpler means than would be the case in an oxide formed on the basic material. Oxide-forming material for the protective layer is advantageously selected in such a way that in addition to the simple removal of the oxide, new oxide is only slowly formed again after the oxide removal. In particular, less than 0.3 nm of oxide, preferably less than 0.1 nm of oxide, is formed on time lapses of at least 2 minutes, preferably at least 5 minutes, more preferably at least 10 minutes, and most preferably at least 15 minutes.

An incorporation of any oxide, formed on the protective layer, in the basic material is in particular at least predominantly prevented according to the invention. To this end, the oxide of the protective material is removed in particular immediately before a bonding process. In the case of a smaller amount of formed oxide, a breaking of the oxide during the later desired bonding process and a direct incorporation into the boundary layer are also conceivable. Protective materials with one or more of the properties cited below are preferably used:

A low oxygen affinity, in particular defined by a standard electrode potential of more than 0 V, preferably more than 1.00 V, more preferably more than 2.00 V, preferably less than the oxygen affinity of the basic material, A high solubility in the basic material, in particular more than 10-5 mol %, preferably more than 10-3 mol %, more preferably more than 1 mol %, most preferably more than 10 mol %, and with utmost preference more than 40 mol %, The properties of the basic material are not negatively influenced, and therefore in the case of the desired high conductivity do not impair the conductivity and in the case of the desired high level of strength do not reduce the strength, Airtight relative to the atmosphere, Economical, High level of availability, Slightly toxic, in particular non-toxic, and/or Good bonding properties.

Accordingly, the invention relates in particular to a method for covering, in particular coating, a first material tending toward oxidation, the basic material, in particular a metal or a semiconductor, with a second material, the protective material. The protective material is in particular dissolved at least partially, in particular predominantly, and preferably completely in another process step by a dissolution process of the basic material and/or forms precipitates partially, in particular predominantly, and preferably completely, in a quite special, expanded embodiment. The embodiment that is preferred according to the invention comprises a complete dissolution of the protective material into the basic material, whereby in this case, no precipitates are produced. The object of the protective layer formed from the protective material consists in particular in the prevention of the oxidation of the basic material. The protective material can itself oxidize upon contact with an oxygen-containing atmosphere and is optionally removed from oxide, before the dissolution process according to the invention begins in the basic material. In a quite special embodiment, the removal of this oxide on the protective layer is performed in a unit in which a renewed oxidation of the protective layer is prevented for design reasons on the way to the bonder. For example, the use of an oxide removal module and a bonding chamber in a corresponding vacuum cluster, which separates the module from the surrounding, oxygen-containing atmosphere, would be conceivable. Such cluster systems are well known to one skilled in the art.

The preferred target of the process according to the invention primarily includes protecting oxygen-affine basic materials, in particular aluminum but also copper, which are to be bonded in an additional process step, up to the actual bonding step before an oxidation. The removal of any oxides of the protective material, which preferably has a much lower oxygen affinity than the basic material to be protected, is considerably simpler, faster, and primarily more reliable, so that the process can be accelerated.

According to a preferred embodiment, the protective material, in particular after a removal of oxides of the protective material, is then bonded with another substrate that is formed in particular according to the invention. Preferably, the protective material is at least partially, in particular predominantly, and preferably completely dissolved during the bonding process in the basic material, so that in the ideal case, no contact occurs between the basic material and the oxygen-rich atmosphere until the bonding takes place.

The method according to the invention is therefore primarily suitable for temporarily protecting with the protective material oxygen-affine basic materials, in particular aluminum or copper, directly after the coating on a substrate.

To the extent the basic material is not full-surface but rather is applied on the substrate in particular in a structured manner and/or only in partial areas (for example copper contacts or aluminum boundaries, which are to be part of a hermetically-sealed space of a MEMS component), the protective material is applied in the form of a film that is as uniformly thick as possible, and in particular is sealed. According to the invention, primarily the ratio of the (in particular middle) layer thickness of the basic material to the layer thickness of the protective material is important. In addition, the chemical, physical and/or metallurgical behavior of the basic material with the protective material according to the invention plays a role.

The basic material is preferably a solid solvent. In particular, the basic material can be a multi-phase-multi-component system. In the case of a multi-phase material, all considerations for the dissolution process are valid at least for a phase, in the ideal case for all phases. As basic material, an individual chemical element is preferably selected, in particular a metal, a semi-metal, or a non-metal, in particular silicon, gallium, aluminum, nickel, titanium or copper. These metals are the materials that are most often used in the semiconductor industry for the production of conductive compounds, contact or structural building blocks (for example MEMS assemblies).

In order to disclose the process according to the invention as simply as possible, the process according to the invention is described by way of example, but not in a limiting manner, with regard to the basic material aluminum. Aluminum is especially suitable according to the invention, since it is a highly-available, economical structural material.

The protective material can in particular also be a multi-phase-multi-component system, but it is preferably a simple chemical element that preferably occurs only in one phase. In this case, it is preferably a metal, a semi-metal, an alkali metal or an alkaline-earth metal. The use of non-metallic elements such as carbon would also be conceivable according to the invention as long as the chemical-physical properties correspond between the non-metal with basic material in terms of the process according to the invention.

The following materials are considered according to the invention in principle as basic material and/or protective material. In this case, the processes according to the invention require that the protective material be at least partially, in particular predominantly, and preferably completely, dissolvable in the basic material.

Metals, in particular
  Cu, Ag, Au, Al, Fe, Ni, Co, Pt, W, Cr, Pb, Ti, Te, Sn, Zn, Ga
Alkali metals, in particular
  Li, Na, K, Rb, Cs
Alkaline-earth metals, in particular
  Mg, Ca, Sr, Ba
Alloys
Semiconductors, provided in particular with corresponding doping
  Element semiconductors, in particular
    Si, Ge, Se, Te, B, Sn
  Compound semiconductors, in particular
    GaAs, GaN, InP, $InxGa1-xN$, InSb, InAs, GaSb, AlN, InN, GaP, BeTe, ZnO, $CuInGaSe_2$, ZnS, ZnSe, ZnTe, CdS, CdSe, CdTe, $Hg(1-x)Cd(x)Te$, BeSe, HgS, $AlxGa1-xAs$, GaS, GaSe, GaTe, InS, InSe, InTe, $CuInSe_2$, $CuInS_2$, $CuInGaS_2$, SiC, SiGe.

For removal of oxide layers of the protective material, preferably the following processes are suitable:
  Chemical oxide removal, in particular by a
    Gaseous reducing agent and/or
    Liquid reducing agent
  Physical oxide removal, in particular with plasma
  Ion-Assisted Chemical Etching, in particular
    Fast Ion Bombardment (FAB, sputtering)
    Grinding, and/or
    Polishing.

For deposition and therefore synthesis of the basic material and/or the protective layer, the following processes are suitable:
  Physical Vapor Deposition (English: Physical Vapor Deposition, PVD)
  Chemical Vapor Deposition (English: Chemical Vapor Deposition, CVD)
  Galvanic method
  Sol-gel method The systems of basic layer and protective layer according to the invention are designed as layer systems and in particular represent a system that is not located in thermodynamic equilibrium. As a result, at a temperature that is elevated relative to room temperature, an interdiffusion, preferably at least predominantly and in particular exclusively, brings about a diffusion of the protective material into the basic material between basic material and protective material.

The systems according to the invention are designed in particular as a diffusion pair. The described phase diagram as well as any phase diagram of the above-mentioned material combinations represent equilibrium states of several phases at various temperatures and concentrations. The conclusions that can be drawn from equilibrium diagrams such as phase diagrams regarding kinetic processes such as diffusion are very limited. In principle, equilibrium diagrams do not allow any assessment on kinetic processes. The phase diagrams are therefore used exclusively to make an assessment as to whether the protective material in general could dissolve at a specific temperature in the basic material. To the extent that local concentration build-ups occur during the diffusion process of the protective material into the basic material, which exceed the solubility of the protective material in the basic material and thus lead to a possible separation, phase formation or the like, this is ignored in the description below. Hereinafter, in principle, the assumption is that the diffusion of the protective material into the basic material is carried out quickly, so that at a given temperature, at no time anywhere in the basic material is the maximum solubility of protective material exceeded. This is achieved in particular according to the invention in that the greater the solubility of the protective material in the basic material at a given temperature, the faster the protective material diffuses into the basic material and/or the smaller the transfer of protective material into the basic material in the protective-material-basic material interface.

The depicted and described phase diagrams were determined by metallurgy. Many components have a very low solubility in the second components in each case, so that the solubility limit is hardly recognizable based on the depiction.

In order to be able to better describe the ideas according to the invention, the idea according to the invention of several systems that are as simple as possible is described. As basic material, the technically very important and to date material that is very difficult to bond, aluminum, is used. Therefore, basic material after the deposition on the bonding side of the substrate is a one-component one-phase system.

As protective materials for the protective layer, four important materials are presented below by way of example, and said materials have the necessary properties according to the invention, namely germanium, gallium, zinc and magnesium. Therefore, this protective material after the deposition is also a one-component-one-phase system. The above-mentioned material combinations are preferred according to the invention, whereby reference is made to the examples described below with the above-mentioned advantages relative to the individual material combination.

The basic material-protective material system of the bonding layer is accordingly a layer system, which is converted preferably during the bonding process by a dissolution process into a two-component-one-phase system. In this case, a mixed crystal comprised of basic material and protective material is preferably produced. The bonding process itself takes place either in an inert gas atmosphere, but more preferably in a vacuum.

In an advantageous embodiment of this invention, precipitates are desired, in particular by at least one heat treatment being carried out after the (successful) bonding process, in order to produce a two-component-two-phase system by at least partial, in particular predominant, and preferably complete, precipitation of the protective material out of the basic material.

Below, based on more advantageous embodiments, the invention is explained, whereby the embodiments in each case can be considered independent invention aspects per se, which aspects are to be disclosed as separate inventions and are to be claimable, in particular in combination with the above general disclosure.

First Embodiment

A first system, to which the idea according to the invention can be applied, is the aluminum-germanium system, Al—Ge for short. The binary Al—Ge system is a purely eutectic system with a partial boundary solubility for germanium in aluminum and a disappearing low boundary solubility of aluminum in germanium. As basic material, aluminum is therefore selected.

In order to protect the aluminum against oxidation, it is immediately covered with a germanium layer as a protective layer after the successful deposition on the substrate. Germanium is therefore the protective material according to the invention.

The germanium layer is in particular less than 10 μm, preferably less than 1 μm, more preferably less than 100 nm, most preferably less than 10 nm, and with utmost preference less than 1 nm.

The deposition is carried out at the lowest possible temperatures, in order to prevent or at least to suppress a partial or even complete diffusion of the germanium at elevated temperature into the aluminum.

In the case of the deposition of the germanium, the temperature of the aluminum is less than 600° C., preferably less than 500° C., more preferably less than 400° C., most preferably less than 300° C., with utmost preference less than 200° C., and even more preferably less than 100° C. In special cases, the aluminum can even be actively cooled in order to further drop the temperature. By the lowest possible temperature, a germanium that is deposited on the aluminum is immediately hindered in its thermal movement and preferably remains on the surface, and therefore does not diffuse into the aluminum.

In addition, the diffusion of the germanium into the aluminum is hampered by the especially low solubility of the germanium in aluminum at low temperatures. Starting from this time, germanium serves as a protective material for the aluminum. If the system is exposed to an oxygen-containing atmosphere, the germanium oxidizes at least predominantly and preferably completely, and thus aluminum protects the latter against oxidation by virtue of the fact that the aluminum is sealed relative to the atmosphere.

In this connection, it is to be considered that the standard electrode potential of germanium is approximately 0.12 V and that of aluminum is approximately −1.66 V. Germanium is therefore nobler than aluminum and is consequently not able to protect aluminum chemically as a sacrifice anode.

Accordingly, the germanium layer is tightly applied in order to build up a physical barrier between the aluminum and the atmosphere.

In order to implement a bond between aluminum and a desired second material, first any germanium oxides formed are removed from the germanium. The removal of the germanium oxides is carried out by physical and/or chemical means. Sputtering-off of oxides, wet-chemical removal by reducing acids, or reduction by hydrogen or other gaseous reducing agents is conceivable. After the removal of germanium oxides, bringing the pure germanium surface into contact with the surface to be bonded, in particular a substrate that is structured analogously in particular according to the invention, is carried out as quickly as possible.

The bonding process is carried out at a bonding temperature that is elevated relative to room temperature. In this case, the bonding temperature is in particular greater than 25° C., preferably greater than 100° C., more preferably greater than 200° C., most preferably greater than 300° C., with utmost preference greater than 400° C., and even more preferably around 426° C. According to the phase diagram, aluminum at approximately 426° C. has the greatest solubility for germanium of approximately 2.5 mol %. According to the invention, in a preferred embodiment, the forming of a liquid, eutectic phase in the boundary area is prevented by the preferred bonding temperature being below the eutectic temperature, in particular between 400° C.-420° C. In this temperature range, the solubility of the germanium in the aluminum is always still high enough to justify dissolution of the germanium into aluminum. According to the invention, the bonding temperature during the bonding process is kept constant at this temperature up to the at least predominant, preferably complete, dissolution of the germanium into aluminum.

The time required for the dissolution can be calculated by the dissolution of the one-dimensional diffusion equation knowing the diffusion constants of germanium into aluminum. Nevertheless, it may be necessary and useful to maintain the temperature for a shorter or longer time. The length of time for dissolving the germanium in aluminum is set, according to the invention, in particular at greater than 1 minute, preferably greater than 10 minutes, more preferably greater than 30 minutes, most preferably greater than 1 hour, with utmost preference greater than 2 hours, and even more preferably greater than 5 hours.

During the dissolution process, the pressure on the substrates that are to be bonded with one another is preferably maintained or increased. The pressure that acts on the bonding layer is in particular greater than 1 Pa, preferably greater than 100 Pa, more preferably greater than 10,000 Pa, most preferably greater than 1 MPa, with utmost preference greater than 10 MPa, and even more preferably greater than 100 MPa. The forces that are used, in particular relative to standard wafers, are greater than 10 N, preferably greater than 100 N, most preferably greater than 1,000 N, with utmost preference greater than 10,000 N, and even more preferably greater than 100,000 N.

During the dissolution process, the germanium preferably dissolves in all of the aluminum. Because of the fact that the amount of germanium to be dissolved is very low at the same time that the amount of dissolving aluminum is very large, the total concentration of the germanium in aluminum is very small. The total concentration of the germanium in aluminum is in particular less than 1 mol %, preferably less than $10^{-3}$ mol %, preferably less than $10^{-5}$ mol %, and most preferably less than $10^{-7}$ mol %. The germanium is dissolved preferably not only exclusively in the region of the aluminum that is near the surface but rather diffuses as deep as possible into the aluminum, preferably so deep that after a specific time, an even distribution of germanium in aluminum has been achieved.

In a first procedure according to the invention, it is provided that during the cooling process, it does not result in exceeding the boundary solubility of the germanium in aluminum, so that germanium always remains completely dissolved in the aluminum. As a result, the precipitation of germanium in the aluminum matrix is prevented in the entire temperature range. This is carried out according to the invention by a ratio of aluminum layer thickness to germanium layer thickness according to the invention being selected and the diffusion process running for a specific amount of time until germanium is distributed into aluminum in particular predominantly, preferably completely, and primarily over the entire available space. The ratio between the germanium layer thickness and aluminum layer thickness is in this case less than 1, preferably less than $10^{-3}$, more preferably less than $10^{-5}$, most preferably less than $10^{-7}$, with utmost preference less than $10^{-9}$, and most preferably less than $10^{-11}$.

In an alternative procedure according to the invention, the germanium layer thickness is set in such a way that at higher temperatures, an in particular at least predominant, preferably complete, dissolution of the germanium is carried out, but a supersaturated mixed crystal is produced during cooling that leads to germanium precipitates. These germanium precipitates can positively influence the strength properties of the aluminum. They preferably result in an increase in strength of the aluminum, in particular in combination with an additional heat treatment.

Second Embodiment

A second system, to which the idea according to the invention can be applied, is aluminum-gallium, Al—Ga for short. The binary aluminum-gallium system is a purely eutectic system with very strong degradation. The eutectic concentration is very close to the concentration of pure gallium.

The boundary solubility of the gallium in aluminum is extraordinarily high and reaches its maximum of approximately 7.5-8.0 mol % at temperatures around 125° C. The boundary solubility of aluminum in gallium is minute, however.

As basic material, the aluminum according to the invention is therefore selected. In order to protect the aluminum against oxidation, it is immediately covered with a gallium layer after the successful deposition. The gallium layer is formed in particular at less than 10 µm, preferably less than 1 µm, more preferably less than 100 nm, most preferably less than 10 nm, and with utmost preference less than 1 nm.

The deposition is carried out at the lowest possible temperatures in order to prevent or at least to suppress a partial or even complete diffusion of gallium at elevated temperature into aluminum. Gallium has a very low melting point of approximately 30° C. In order to prevent the gallium layer applied on aluminum from liquefying, a temperature of below 30° C. is set. According to the invention, it would be conceivable, however, that at higher temperatures, the gallium remains in liquid form on the aluminum, without hampering the handling of the entire wafer. The reason may be primarily the extremely small amount of deposited gallium, which has a high enough surface tension and a high enough adhesion to aluminum to continue to exist as a liquid metal film.

In the second embodiment, it is provided according to the invention that the gallium diffuses at moderate temperatures into aluminum. Therefore, the subsequent bonding process is performed as shortly as possible after the basic layer is covered with the protective layer.

In the case of the deposition of the gallium, the temperature of the aluminum is less than 300° C., preferably less than 200° C., more preferably less than 100° C., most preferably less than 50° C., with utmost preference less than 30° C., and even more preferably less than 0° C. In special cases, the aluminum can even be actively cooled by further dropping the temperature. If the system is exposed to an oxygen-containing atmosphere, the gallium preferably oxidizes and thus protects the aluminum.

In this connection, it is to be considered that the standard electrode potential of gallium is approximately −0.53 V and that of aluminum is approximately −1.66 V. Gallium is therefore nobler than aluminum and is consequently not able to protect aluminum chemically as a sacrifice anode. Accordingly, the gallium layer is tightly applied in order to build up a physical barrier between the aluminum and the atmosphere.

The boundary solubility of gallium in aluminum is also still extremely high at room temperature, if not even just below at the maximum of the already mentioned 7.5-8.0 mol %. The boundary solubility of the gallium in aluminum decreases again only below room temperature. A precipitation of dissolved gallium in aluminum can therefore be avoided in this embodiment of the invention.

By the especially high solubility of gallium in aluminum, in particular also even at room temperature, the material gallium is especially suitable in this respect to be dissolved in aluminum.

According to the invention, the process parameters are set so that the concentration of gallium in aluminum at any time is less than the boundary solubility, since otherwise a two-phase system can be produced from an aluminum mixed crystal with gallium and a liquid phase. This would have the effect that the bonding can no longer be implemented since the liquid phase also still exists at room temperature.

In contrast, specifically the low melting point and the possibility to liquefy at extremely low temperatures are an optimal requirement for a subsequent bonding process. By means of the most minor temperature increases, gallium is liquefied on the surface of the aluminum and thus as a liquid phase matches the contours of the two surfaces that are to be connected to one another. Although it is the actual idea of the invention according to the invention to dissolve gallium in aluminum, the capability of liquefaction at low temperatures for supporting the bonding process before the actual dissolution process is disclosed in this respect as an independent aspect of the invention.

In order to implement a bonding between aluminum and a desired second material, first any gallium oxides formed are removed from the gallium. Just like aluminum, gallium coats itself with a thick oxide layer and is thus passivated. Gallium forms a gallium hydroxide layer with water. The removal of gallium oxides is carried out by physical and/or chemical means.

Sputtering-off of oxides, wet-chemical removal by reducing acids and/or liquors, or reduction by hydrogen or other gaseous reducing agents is conceivable. After the removal of gallium oxides, bringing the pure gallium surface into contact with the surface to be bonded, in particular a substrate that is structured analogously in particular according to the invention, is carried out as quickly as possible.

The bonding process is carried out at a temperature that is elevated relative to room temperature. In this case, the bonding temperature is in particular greater than 25° C., preferably greater than 100° C., more preferably greater than 200° C., most preferably greater than 300° C., with utmost preference greater than 400° C., and even more preferably around 426° C. According to the phase diagram, aluminum has the greatest solubility for germanium of approximately 8 mol % between 77° C. and 177° C.

Preventing the forming of a liquid, eutectic phase in the boundary area is very difficult in the case of an Al—Ga diffusion pair. Since dissolving gallium in aluminum is preferred according to the invention and since diffusion is to take place as quickly as possible, a brief existence of a liquid phase according to the invention is acceptable. According to the invention, the bonding temperature during the bonding process is kept constant at this temperature up to the at least predominant, preferably complete, dissolution of gallium in aluminum.

The required time can be calculated by solving the one-dimensional diffusion equation knowing the diffusion constants of gallium in aluminum. Nevertheless, it may be necessary and useful to maintain the temperature for a shorter or longer time. The length of time for dissolving gallium in aluminum is in this case greater than 1 minute, preferably greater than 10 minutes, more preferably greater than 30 minutes, most preferably greater than 1 hour, with utmost preference greater than 2 hours, and even more preferably greater than 5 hours.

During the dissolution process, the pressure is preferably maintained or even increased on the substrates that are to be bonded with one another. The prevailing pressure is in particular greater than 1 Pa, preferably greater than 100 Pa, more preferably greater than 10,000 Pa, most preferably greater than 1 MPa, with utmost preference greater than 10 MPa, and even more preferably greater than 100 MPa. The forces that are used, in particular relative to standard wafers, are greater than 10 N, preferably greater than 100 N, most preferably greater than 1,000 N, with utmost preference greater than 10,000 N, and even more preferably greater than 100,000 N.

During the dissolution process, gallium preferably dissolves in all of the aluminum. Because of the fact that the amount of gallium to be dissolved is very small but the amount of aluminum to be dissolved is very large, the total concentration of gallium in aluminum is very small. The total concentration of gallium in aluminum is in particular less than 10 mol %, preferably less than 5 mol %, preferably less than 1 mol %, and most preferably less than $10^{-3}$ mol %. Gallium is preferably dissolved not only exclusively in the region of the aluminum that is near the surface but rather diffuses as deep as possible into the aluminum, preferably so deep that after a specific time, an even distribution of gallium in aluminum has been achieved.

In a procedure according to the invention, it is now ensured that during the cooling process, the boundary solubility of gallium in aluminum is never exceeded, so that gallium always remains completely dissolved in aluminum. As a result, the precipitation of gallium in the aluminum matrix is prevented in the entire temperature range. In the Al—Ga system, this is technically very simple to bring about since the change in the boundary solubility of gallium in aluminum is marginal in the temperature range between approximately 130° C. and room temperature, i.e., it does not change particularly much. As a result, during the cooling process, there is virtually no danger that a (significant) precipitation of gallium in aluminum occurs. The ratio between the gallium layer thickness and the aluminum layer thickness is in this case less than 1, preferably less than $10^{-3}$, more preferably less than $10^{-5}$, most preferably less than $10^{-7}$, with utmost preference less than $10^{-9}$, and even more preferably less than $10^{-11}$.

Third Embodiment

A third system, to which the idea according to the invention can be applied, is the aluminum-zinc system, Al—Zn for short. The binary aluminum-zinc system is a binary system that has a zinc-rich eutectic and a zinc-rich eutectoid. For the ideas according to the invention, in particular the boundary solubilities of the system partners are important. According to the Al—Zn phase diagram, aluminum has a boundary solubility for zinc, and zinc has a boundary solubility, albeit a small one, for aluminum. Since aluminum is preferably used as basic material and zinc is preferably used as a protective layer, only the aluminum-rich side of the phase diagram is important.

In order to protect aluminum against oxidation, it is immediately covered with a zinc layer as a protective layer after the successful deposition on the substrate. Zinc is thus the protective material for protection of the basic layer against oxidation.

The zinc layer is in particular less than 10 μm, preferably less than 1 μm, more preferably less than 100 nm, most preferably less than 10 nm, and with utmost preference less than 1 nm.

The deposition is carried out at the lowest possible temperatures in order to prevent or at least to suppress a partial or even complete diffusion of zinc at elevated temperature into aluminum.

In the case of the deposition of zinc, the temperature of aluminum is less than 600° C., preferably less than 500° C., more preferably less than 400° C., most preferably less than 300° C., with utmost preference less than 200° C., and even more preferably less than 100° C. In special cases, the aluminum can even be actively cooled in order to further drop the temperature. By the lowest possible temperature, the zinc that is deposited on the aluminum is immediately impeded in its thermal movement and preferably remains on the surface, and it therefore does not diffuse into aluminum.

In addition, by the especially low solubility of zinc in aluminum at low temperatures, the diffusion of zinc into aluminum is hampered. From this time, zinc serves as protective material for aluminum. If the system is exposed to an oxygen-containing atmosphere, the zinc at least predominantly, preferably completely, oxidizes, and the latter thus protects the aluminum against oxidation, in particular by the aluminum being sealed relative to the atmosphere.

In this connection, it is to be considered that the standard electrode potential of zinc is approximately −0.76 V, and that of aluminum is approximately −1.66 V. Zinc is therefore nobler than aluminum and is consequently not able to protect aluminum chemically as a sacrifice anode. Accordingly, the zinc layer is tightly applied in order to build up a physical barrier between aluminum and the surrounding area, in particular the atmosphere.

In order to implement a bond between aluminum and a desired second material, first any zinc oxides formed are removed from the zinc. The removal of the zinc oxides is carried out in particular by physical and/or chemical means. Sputtering-off of oxides, wet-chemical removal by reducing acids, or reduction by hydrogen or other gaseous reducing agents, in particular carbon monoxide, is conceivable according to the invention.

After the removal of zinc oxides, bringing the pure zinc surface into contact with the surface to be bonded is carried out as quickly as possible. The bonding process is carried out at an elevated temperature relative to room temperature. In this case, the bonding temperature is greater than 25° C., preferably greater than 100° C., more preferably greater than 200° C., most preferably greater than 300° C., with utmost preference greater than 400° C., and even more preferably around 380° C. According to the phase diagram, of between approximately 350° C. and approximately 380° C., zinc has an extremely large area with a high solubility for zinc in aluminum.

According to the invention, the amount of deposited zinc is set low so that after the complete and primarily uniform distribution of zinc in aluminum, no concentrations are set in a range above 1 mol % of zinc, much less 50-60 mol % of zinc. The large solubility range is well suited in this respect to avoid any local concentration peaks without exceeding the concentration range of a mixed crystal that is desired according to the invention. By a correspondingly long heat treatment, any concentration peak of the zinc in aluminum is again reduced by a uniform distribution of zinc in aluminum so that the final end concentration of the zinc in aluminum, reached before the cooling process, preferably lies below the boundary solubility of the zinc in aluminum at room temperature.

According to the invention, preferably during the bonding process, the system is therefore maintained within this temperature range for the length of time that is required in order to dissolve all of the zinc in aluminum. Nevertheless, even at approximately 280° C., the boundary solubility of the zinc in aluminum is high enough to implement the process according to the invention. The required time can be calculated by solving the one-dimensional diffusion equation knowing the diffusion constants of zinc in aluminum. Nevertheless, it may be useful according to the invention to maintain the temperature for a shorter or longer time.

The length of time for dissolving zinc in aluminum is set in particular at greater than 1 minute, preferably greater than 10 minutes, more preferably greater than 30 minutes, most preferably greater than 1 hour, with utmost preference greater than 2 hours, and even more preferably greater than 5 hours.

During the dissolution process, the pressure is preferably maintained or increased on the substrates that are to be bonded with one another. The prevailing pressure is in particular greater than 1 Pa, preferably greater than 100 Pa, more preferably greater than 10,000 Pa, most preferably greater than 1 MPa, with utmost preference greater than 10 MPa, and even more preferably greater than 100 MPa. The forces that are used, in particular relative to standard wafers, are greater than 10 N, preferably greater than 100 N, most preferably greater than 1,000 N, with utmost preference greater than 10,000 N, and even more preferably greater than 100,000 N.

During the dissolution process, the zinc is preferably dissolved in all of the aluminum. Because of the fact that the amount of zinc to be dissolved is very small but the amount of the dissolving aluminum is very large, the total concentration of zinc in aluminum is very small. The zinc is preferably dissolved not only exclusively in the region of the aluminum that is near to the surface, but rather diffuses as deep as possible into the aluminum, preferably so deep that after a specific time, an even distribution of zinc in aluminum has been achieved.

In a first procedure according to the invention, it is now ensured that during the cooling process, the boundary solubility of zinc in aluminum is not exceeded, so that zinc always remains completely dissolved in aluminum. As a result, the precipitation of zinc in the aluminum matrix is prevented in the entire temperature range according to the invention. This is carried out according to the invention by a ratio of aluminum layer thickness to zinc layer thickness according to the invention being selected and the diffusion process being run for a specific time until the zinc is distributed completely, in particular in the entire available space, in aluminum. The ratio between the zinc layer thickness and aluminum layer thickness in this case is less than 1, preferably less than $10^{-3}$, more preferably less than $10^{-5}$, most preferably less than $10^{-7}$, with utmost preference less than $10^{-9}$, and even more preferably less than $10^{-11}$.

According to another procedure according to the invention, the zinc layer thickness is set in such a way that at higher temperatures, a dissolution of the zinc into aluminum that is in particular at least predominant and preferably complete, is carried out, but during cooling, a supersaturated mixed crystal is produced that results in zinc precipitates. These zinc precipitates can positively influence the strength properties of aluminum. They preferably result in an increase in strength of the aluminum, in particular in combination with a heat treatment.

Fourth Embodiment

A fourth system, to which the idea according to the invention can be applied, is the aluminum-magnesium system, Al—Mg for short. The binary Al—Mg system is a binary system that consists of two eutectics with boundary solubility for magnesium in aluminum as well as a boundary solubility for aluminum in magnesium. As basic material, aluminum is preferably selected.

In order to protect the aluminum against oxidation, it is immediately covered with a magnesium layer after the successful deposition of the magnesium material. Magnesium is a very reactive alkaline-earth metal, primarily in its pure form.

The magnesium layer is in particular less than 10 μm, preferably less than 1 μm, more preferably less than 100 nm, most preferably less than 10 nm, and with utmost preference less than 1 nm.

The deposition is carried out at the lowest possible temperatures in order to prevent or at least to suppress a partial or even complete diffusion of the magnesium at elevated temperature in the aluminum.

In the case of the deposition of magnesium, the temperature of aluminum is less than 600° C., preferably less than 500° C., more preferably less than 400° C., most preferably less than 300° C., with utmost preference less than 200° C., and even more preferably less than 100° C. In special cases, the aluminum can even be actively cooled in order to further drop the temperature. Because of the lowest possible temperature, a magnesium that is deposited on the aluminum is immediately hindered in its thermal movement and preferably remains on the surface, i.e., does not diffuse into the aluminum.

In addition, the diffusion of magnesium into aluminum is hampered by the especially low solubility of magnesium in aluminum at low temperatures. Starting from this time, magnesium serves as protective material for aluminum. If the system is exposed to an oxygen-containing atmosphere, the magnesium preferably oxidizes and thus protects the aluminum.

In this connection, it is to be considered that the standard electrode potential of magnesium is approximately −2.36 and that of aluminum is approximately −1.66 V. Magnesium is therefore a more base material than aluminum and is consequently able to protect aluminum chemically as a sacrifice anode. It would perhaps even be conceivable that the deposited magnesium is used directly as a reducing agent for aluminum oxide that is already at least partially formed or not completely removed. The reduction process can be performed by a separate, additional heat treatment step and preferably reduces the magnesium-covered aluminum oxide to form pure aluminum with the formation of magnesium oxide. Hereinafter, in particular an independent aspect of the invention is found that, in combination with any additional method features disclosed, is to be valid and is to be claimable.

In order to implement a bond between aluminum and a desired second material, first any magnesium oxides formed must be removed from magnesium. The removal of the magnesium oxides is carried out by physical and/or chemical means. Sputtering-off of oxides, wet-chemical removal by reducing acids, or reduction by hydrogen or other gaseous reducing agents is conceivable according to the invention. It is to be considered in this connection that magnesium oxides should be fairly stable structures that can be removed completely by wet-chemical means only with great difficulty; thus, physical methods according to the invention are rather suitable.

After the removal of magnesium oxides, bringing the pure magnesium surface into contact with the surface to be bonded is carried out as quickly as possible. The bonding process is carried out at an elevated temperature. In this case, the bonding temperature is greater than 25° C., preferably greater than 100° C., more preferably greater than 200° C., most preferably greater than 300° C., with utmost preference greater than 400° C., and even more preferably around 426° C.

According to the phase diagram, aluminum at approximately 452° C. has the greatest solubility for magnesium of approximately 16 mol %. However, if it is desired to prevent a liquid phase from forming in the boundary area and only to provide that the solid magnesium is dissolved in solid aluminum, the preferred bonding temperature is below the above-mentioned 452° C. In this temperature range, the solubility of the magnesium in aluminum is always still high enough to produce a noticeable dissolution of the magnesium in aluminum. According to the invention, the temperature is maintained for the time of the in particular predominant, preferably complete, dissolution of magnesium in aluminum. The required time can be calculated by solving the one-dimensional diffusion equation knowing the diffusion constants of magnesium in aluminum. According to the invention, it may be useful to maintain the temperature for a shorter or longer time.

The length of time for dissolving magnesium in aluminum is set in particular at greater than 1 minute, preferably greater than 10 minutes, more preferably greater than 30 minutes, most preferably greater than 1 hour, with utmost preference greater than 2 hours, and even more preferably greater than 5 hours.

During the dissolution process, the pressure on the substrates that are to be bonded with one another is preferably maintained or increased. The prevailing pressure is in particular greater than 1 Pa, preferably greater than 100 Pa, more preferably greater than 10,000 Pa, most preferably greater than 1 MPa, with utmost preference greater than 10 MPa, and even more preferably greater than 100 MPa. The forces used that act on the wafer are greater than 10 N, preferably greater than 100 N, most preferably greater than 1,000 N, with utmost preference greater than 10,000 N, and even more preferably greater than 100,000 N.

During the dissolution process, the magnesium preferably dissolves in all of the aluminum. Because of the fact that the amount of magnesium to be dissolved is very small and the amount of dissolving aluminum is very large, the total concentration of the magnesium in aluminum is very small. The magnesium is dissolved preferably not only exclusively in the region of the aluminum that is near the surface but rather diffuses as deep as possible into the aluminum, preferably so deep that after a specific time, an even distribution of germanium in aluminum has been achieved.

In a first procedure according to the invention, it is provided that during the cooling process, it does not result in exceeding the boundary solubility of the magnesium in aluminum, so that magnesium always remains completely dissolved in the aluminum. As a result, the precipitation of a stoichiometric aluminum-magnesium phase in the aluminum matrix is prevented in the entire temperature range according to the invention. This is carried out according to the invention by a ratio of aluminum layer thickness to magnesium layer thickness according to the invention being selected and by giving the diffusion process enough time until magnesium is distributed in the aluminum completely, and primarily over the entire available space. The ratio between the magnesium layer thickness and aluminum layer thickness is selected in particular less than 1, preferably less than $10^{-3}$, more preferably less than $10^{-5}$, most preferably less than $10^{-7}$, with utmost preference less than $10^{-9}$, and even more preferably less than $10^{-11}$.

In an alternative procedure according to the invention, the magnesium layer thickness is set in such a way that at higher temperatures, an in particular predominant, preferably complete, dissolution of the magnesium is carried out, but during cooling, a supersaturated mixed crystal is produced that leads to the precipitation of the stoichiometric aluminum-magnesium phase. The aluminum-magnesium phase precipitates can positively influence the strength properties of the aluminum. They preferably result in an increase in strength of the aluminum, in particular in combination with a heat treatment.

In quite special embodiments, the basic material is ground and/or polished before the deposition of the protective material. In this case, it results in a planarization of the surface, which is of decisive importance for the later bonding process. The mean roughness and/or the quadratic roughness are less than 100 μm, preferably less than 10 μm, more preferably less than 1 μm, most preferably less than 100 nm, with utmost preference less than 10 nm, and even more preferably less than 1 nm. The polishing can take place by purely mechanical and/or chemical means. Most optimal is a chemical-mechanical polishing (CMP).

Should an oxide layer have formed on the basic material, the latter is preferably already removed by the above-mentioned processes. Should the removal of oxide by the above-mentioned processes not suffice, the already mentioned processes for oxide removal, such as, for example, sputtering, use of reducing gases and/or acids, can be used in addition. After the planarization and optional purification of oxide, the coating of the protective layer is then carried out.

For all embodiments according to the invention, it holds true according to an advantageous embodiment of the invention that the bonding process of a second heat treatment process that takes place later can take place in particular spatially separately. In the bonding unit, preferably only the actual bonding process is performed. The bonding process lasts in particular less than 5 hours, preferably less than 1 hour, more preferably less than 30 minutes, most preferably less than 15 minutes, and with utmost preference less than 5 minutes.

As soon as the bonding step was completed and a high enough adhesion between two substrates exists, the bonded substrate pair can be removed from the bonder in order to be further treated, in particular heat-treated, in another unit. Such a heat treatment unit is preferably a batch unit, therefore a unit that can simultaneously accommodate, perhaps even continuously, a large number of wafers. The heat treatment in such a heat treatment unit is carried out according to the invention in particular longer than 5 minutes, preferably longer than 30 minutes, more preferably longer than 1 hour, and most preferably longer than 5 hours. The temperature in such a heat treatment unit is preferably adjustable, preferably adjustable along a path and/or as a function of time, so that the processed substrates can run through exact temperature profiles. The temperatures that are used are in particular greater than 25° C., preferably greater than 100° C., more preferably greater than 300° C., more preferably greater than 500° C., and with utmost preference greater than 800° C. The heat treatment can preferably take place in an inert gas atmosphere in order to protect the open surfaces of substrates against unnecessary or unintended oxidation.

In such a heat treatment plant, all conceivable heat treatment steps can be performed. It would be conceivable in particular that the actual dissolution of the protective layer according to the invention into the basic material is carried out only in the heat treatment unit. The heat treatment unit can bring several pairs of substrates at the same time to a higher temperature than would be the case in a bonding unit. In the case of a continuously operating heat treatment unit that takes up substrate pairs on one side, continuously conveys them through the unit, for example by an assembly line, and releases them again on another end, even the setting of a temperature gradient over the path would be conceivable over time, and therefore, in particular, in the case of constant assembly line speed. According to the invention, the diffusion of the protective material into the basic material should only be carried out, however, outside of a bonding unit when no pressure is necessary for the production of a corresponding solid bond between the substrates.

After making successful contact and a successful bond between the substrates, in particular after the dissolution of the protective material into the basic material according to the invention, an attempt is made to achieve recrystallization of the structure, working as much as possible over the entire thickness of the two basic material layers. This recrystallization can take place in the heat treatment unit if the process does not already take place during the actual bonding process.

The recrystallization leads to a new construction of the grains, in particular via the bonding boundary surface, and thus produces a mechanically stable, solid and permanent basic material layer that extends through along the entire thickness. The new microstructure formed by recrystallization has the optimal and actually desired structure, since in this structure, a bonding boundary surface is no longer present. Methods for at least partially controllable recrystallization of the structure are preferably used. These include in particular the increase in the dislocation density and/or a correspondingly high temperature.

In the most preferred embodiment, the dissolution of the protective material in the basic material according to the invention as well as the recrystallization of the structure are carried out in an external heat treatment unit, in particular separated from the bonder. As a result, the bonder is available for the next substrate bond as quickly as possible. In a quite special embodiment, the dissolution process according to the invention as well as the recrystallization take place simultaneously. Further advantages, features and details of the invention are produced from the subsequent description of preferred embodiments and based on the drawings.

DETAILED DESCRIPTION OF INVENTION

Figure 1:
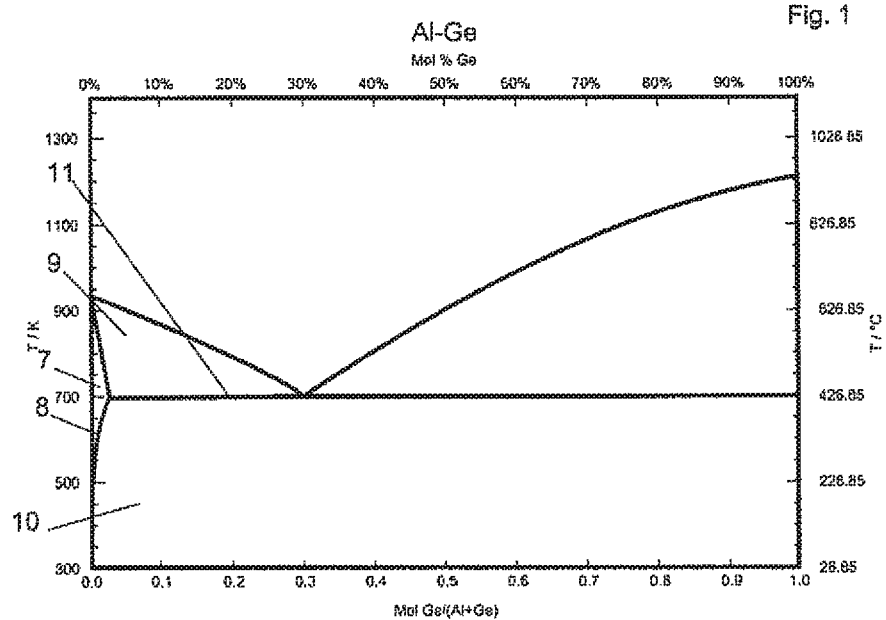
FIG. 1 a depiction of the binary Al—Ge phase diagram,
FIG. 2 a depiction of the binary Al—Ga phase diagram,
FIG. 3 a depiction of the binary Al—Zn phase diagram,
FIG. 4 a depiction of the binary Al—Mg phase diagram,
FIG. 5a a diagrammatic cross-sectional depiction of an embodiment of a substrate according to the invention with a full-surface basic layer that consists of a basic material and a full-surface protective layer that consists of a protective material with alignment,
FIG. 5b a diagrammatic cross-sectional depiction according to FIG. 5a with a contact/bonding step, and
FIG. 5c a diagrammatic cross-sectional depiction according to FIG. 5a according to the bonding step.

FIG. 1 shows a first binary Al—Ge system by way of example. The important part in the phase diagram according to the invention is the mixed crystal area 7. The mixed crystal area 7 is separated from the two-phase areas 9, 10 by the boundary solubility 8. The boundary solubility for germanium decreases with decreasing temperature, starting from the eutectic temperature or the eutecticals 11. The boundary solubility for germanium also decreases with increasing temperature, starting from the eutectic temperature or the eutecticals 11.

Figure 2:
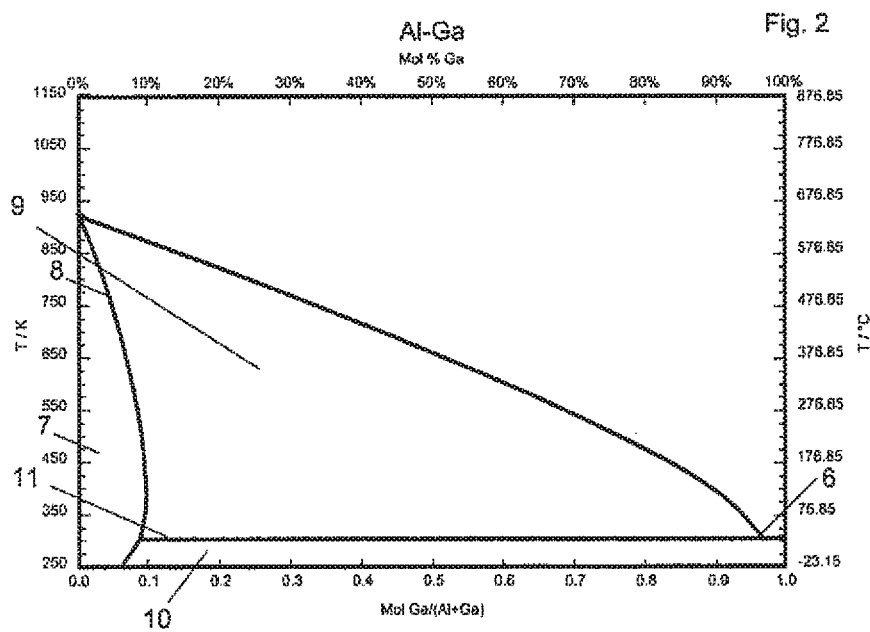

FIG. 2 shows a second binary Al—Ga system by way of example. The important part according to the invention in the phase diagram is the mixed crystal area 7. The mixed crystal area 7 is separated by the boundary solubility 8 from the two-phase areas 9, 10. The boundary solubility for gallium decreases with decreasing temperature, starting from the eutectic temperature or the eutecticals 11. The boundary solubility for gallium decreases also with increasing temperature, starting from the eutectic temperature or the eutecticals 11. The degradation of the eutectic by a eutectic point 6 that lies very near in the concentration of the pure germanium is characteristic.

FIG. 3 shows a third binary Al—Zn system by way of example. The important part according to the invention in the phase diagram is the mixed crystal area 7. The mixed crystal area 7 is very pronounced here. At temperatures around 370° C., it reaches up to more than 65 mol % of zinc. The mixed crystal area 7 is separated by the boundary solubility 8' from the two-phase area 10. The boundary solubility for zinc decreases with decreasing temperature, starting from the eutectoid temperature or the eutectoids 11'.

FIG. 4 shows a fourth binary Al—Mg system by way of example. The important part according to the invention in the phase diagram is the mixed crystal area 7. The mixed crystal area 7 is separated by the boundary solubility 8 from the two-phase areas 9, 10. The boundary solubility for magnesium decreases with decreasing temperature, starting from the eutectic temperature or the eutecticals 11. The boundary solubility for magnesium also decreases with increasing temperature, starting from the eutectic temperature or the eutecticals 11.

Figure 5A:
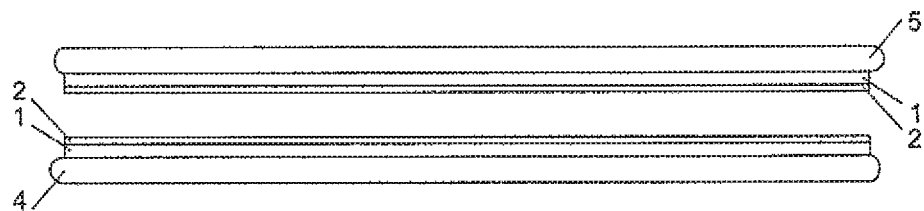

FIG. 5a shows as simple a system according to the invention as possible, comprised of a first substrate 4 and a second substrate 5. Both substrates 4 and 5 are coated with a basic material 1 and a protective material 2. In an embodiment according to the invention, basic material 1 and protective material 2 are not necessarily applied on the full surface on the first substrate 4 but rather have undergone a specific structuring before the bonding. In this step, possible oxide layers of the protective material 2 have already been removed.

Figure 5B:
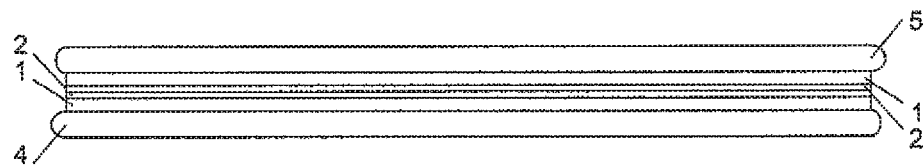

FIG. 5b shows a contact or bonding step of the two substrates 4 and 5. If the two substrates were structured, a previous orienting step would have had to have oriented the two substrates to one another before the actual contact or bonding step would take place.

Figure 5C:

Finally, FIG. 5c shows the mixed crystal 12 that is produced and that is carried out by the diffusion of the protective layer material 2 into the basic material 1.

LIST OF REFERENCE SYMBOLS

1 Basic Material
2 Protective Material
3 Oxide Layer
4 First Substrate
5 Second Substrate
6 Eutectic Point
7 Mixed Crystal Area
8 Boundary Solubility
9 Two-Phase Area: Liquid, Solid
10 Two-Phase Area: Solid, Solid
11, 11' Eutecticals, Eutectoids
12 Mixed Crystal Having described the invention, the following is claimed:

1. A method for bonding a first substrate with a second substrate, said method comprising:
    applying an oxidizable basic material as a basic layer on a bonding side of the first substrate;
    at least partially covering the basic layer with a protective layer having a thickness of less than 100 nm, the protective layer being comprised of a protective material containing at least one non-metal chemical element selected from the group consisting of Si, Se, C, O, and Te; and
    bonding the first and second substrates,
    wherein the protective material is dissolved completely in the basic material during the bonding.

2. The method according to claim 1, wherein the basic material is oxygen-affine and is comprised of aluminum and/or copper.

3. The method according to claim 1, wherein the step of applying the basic material as the basic layer and/or covering the basic layer with the protective layer is/are carried out by deposition.

4. The method according to claim 1, wherein the covered basic layer is sealed by the protective layer at least predominantly relative to the atmosphere.

5. The method according to claim 1, further comprising:
    treating the protective layer before the step of bonding with one or more of the following processes:
    (a) chemical oxide removal;
    (b) physical oxide removal, in particular with plasma; and
    (c) ion-assisted chemical etching.

6. The method according to claim 5, wherein said chemical oxide removal process includes a gaseous reducing agent and/or a liquid reducing agent.

7. The method according to claim 5, wherein said ion-assisted chemical etching process includes fast ion bombardment, grinding, and/or polishing.

8. The method according to claim 1, wherein the basic material is one or more materials selected from the group consisting of metals, alkali metals, alkaline-earth metals, alloys, and semiconductors provided with corresponding doping.

9. The method according to claim 8, wherein the protective material further contains one or more materials selected from the group consisting of metals, alkali metals, alkaline-earth metals, alloys, and semiconductors provided with corresponding doping.

10. The method according to claim 9, wherein said semiconductors are selected from the group consisting of element semiconductors and compound semiconductors.

11. The method according to claim 10, wherein said element semiconductors are selected from the group consisting of Si, Ge, Se, Te, and Sn.

12. The method according to claim 10, wherein said compound semiconductors are selected from the group consisting of GaAs, GaN, InP, $In_xGa_{1-x}N$, InSb, InAs, GaSb, AlN, InN, GaP, BeTe, ZnO, $CuInGaSe_2$, ZnS, ZnSe, ZnTe, CdS, CdSe, CdTe, $Hg_{(1-x)}Cd_{(x)}Te$, BeSe, HgS, $Al_xGa_{1-x}As$, GaS, GaSe, GaTe, InS, InSe, InTe, $CuInSe_2$, $CuInS_2$, $CuInGaS_2$, SiC, and SiGe.

13. The method according to claim 9, wherein said metals are selected from the group consisting of Cu, Ag, Au, Al, Fe, Ni, Co, Pt, W, Cr, Pb, Ti, Te, Sn, Zn, and Ga,
    wherein said alkali metals are selected from the group consisting of Li, Na, K, Rb, and Cs, and
    wherein said alkaline earth metals are selected from the group consisting of Mg, Ca, Sr, and Ba.

14. The method according to claim 8, wherein said metals are selected from the group consisting of Cu, Ag, Au, Al, Fe, Ni, Co, Pt, W, Cr, Pb, Ti, Te, Sn, Zn, and Ga.

15. The method according to claim 8, wherein said alkali metals are selected from the group consisting of Li, Na, K, Rb, and Cs.

16. The method according to claim 8, wherein said alkaline earth metals are selected from the group consisting of Mg, Ca, Sr, and Ba.

17. The method according to claim 8, wherein said semiconductors are selected from the group consisting of element semiconductors and compound semiconductors.

18. The method according to claim 17, wherein said element semiconductors are selected from the group consisting of Si, Ge, Se, Te, and Sn.

19. The method according to claim 17, wherein said compound semiconductors are selected from the group consisting of GaAs, GaN, InP, $In_xGa_{1-x}N$, InSb, InAs, GaSb, AlN, InN, GaP, BeTe, ZnO, $CuInGaSe_2$, ZnS, ZnSe, ZnTe, CdS, CdSe, CdTe, $Hg_{(1-x)}Cd_{(x)}Te$, BeSe, HgS, $Al_xGa_{1-x}As$, GaS, GaSe, GaTe, InS, InSe, InTe, $CuInSe_2$, $CuInS_2$, $CuInGaS_2$, SiC, and SiGe.

20. A method for bonding a first substrate with a second substrate, said method comprising:
- applying an oxidizable basic material as a basic layer on a bonding side of the first substrate;
- at least partially covering the basic layer with a protective layer having a thickness of less than 100 nm, the protective layer being comprised of a protective material containing at least one non-metal chemical element selected from the group consisting of Si, Se, Te, C, O, and B; and
- bonding the first and second substrates,
- wherein the protective material is dissolved completely in the basic material during the bonding.

* * * * *